(12) United States Patent
Siemieniec et al.

(10) Patent No.: US 10,050,113 B2
(45) Date of Patent: Aug. 14, 2018

(54) SEMICONDUCTOR DEVICE WITH NEEDLE-SHAPED FIELD PLATES AND A GATE STRUCTURE WITH EDGE AND NODE PORTIONS

(71) Applicant: Infineon Technologies Austria AG, Villach (AT)

(72) Inventors: Ralf Siemieniec, Villach (AT); Oliver Blank, Villach (AT); David Laforet, Villach (AT); Cedric Ouvrard, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/439,986

(22) Filed: Feb. 23, 2017

(65) Prior Publication Data

US 2017/0250256 A1  Aug. 31, 2017

(30) Foreign Application Priority Data

Feb. 29, 2016 (DE) .......................... 10 2016 103 581

(51) Int. Cl.
| | |
|---|---|
| *H01L 29/40* | (2006.01) |
| *H01L 29/423* | (2006.01) |
| *H01L 29/06* | (2006.01) |
| *H01L 29/73* | (2006.01) |
| *H01L 29/78* | (2006.01) |
| *H01L 29/739* | (2006.01) |

(52) U.S. Cl.
CPC ........ *H01L 29/407* (2013.01); *H01L 29/0696* (2013.01); *H01L 29/404* (2013.01); *H01L 29/4236* (2013.01); *H01L 29/4238* (2013.01); *H01L 29/7813* (2013.01); *H01L 29/7391* (2013.01); *H01L 29/7397* (2013.01); *H01L 29/7827* (2013.01)

(58) Field of Classification Search
CPC ............... H01L 29/407; H01L 29/7813; H01L 29/4238; H01L 29/4236; H01L 29/0696; H01L 29/404; H01L 29/7827; H01L 29/7397; H01L 29/7391
USPC ........................................................ 257/331
See application file for complete search history.

(56) References Cited

U.S. PATENT DOCUMENTS

| | | |
|---|---|---|
| 9,252,263 B1 | 2/2016 | Vielemeyer et al. |
| 2012/0061753 A1 | 3/2012 | Nishiwaki |
| | (Continued) | |

FOREIGN PATENT DOCUMENTS

| | | |
|---|---|---|
| DE | 102005052734 B4 | 2/2012 |
| DE | 102014109924 B3 | 11/2015 |
| | (Continued) | |

*Primary Examiner* — Caleen Sullivan
(74) *Attorney, Agent, or Firm* — Murphy, Bilak & Homiller, PLLC (57) ABSTRACT

A semiconductor device includes needle-shaped field plate structures extending from a first surface into transistor sections of a semiconductor portion in a transistor cell area. A grid structure separates the transistor sections from each other. The grid structure includes: stripe-shaped gate edge portions extending along one edge of the transistor sections, respectively; gate node portions wider than the gate edge portions and connecting two or more of the gate edge portions, respectively; and one or more connection sections of the semiconductor portion, wherein the one or more connection sections extend between neighboring transistor sections.

21 Claims, 11 Drawing Sheets

(56) References Cited

U.S. PATENT DOCUMENTS

2012/0138950 A1 6/2012 Roberts et al.
2016/0013280 A1 1/2016 Laforet et al.

FOREIGN PATENT DOCUMENTS

SEMICONDUCTOR DEVICE WITH NEEDLE-SHAPED FIELD PLATES AND A GATE STRUCTURE WITH EDGE AND NODE PORTIONS

BACKGROUND

In power semiconductor devices, for example IGFETs (insulated gate field effect transistors) a load current typically flows in a vertical direction between two load electrodes formed at opposite sides of a semiconductor die. In a blocking mode field plate structures extending from one side into the semiconductor die deplete a drift portion of the semiconductor die and facilitate higher dopant concentrations in the drift portion without adverse impact on the blocking capability. Shrinking the field plate structures to needle-shaped field plate structures increases an active transistor area and allows for increasing the total channel width by forming a grid-like gate structure between the field plate structures.

It is desirable to improve reliable semiconductor devices with needle-shaped field electrodes and low parasitic capacitances.

SUMMARY

According to an embodiment a semiconductor device includes needle-shaped field plate structures that extend from a first surface into transistor sections of a semiconductor portion in a transistor cell area. A grid structure separates the transistor sections from each other. Stripe-shaped gate edge portions of the grid structure extend along edges of the transistor sections. Gate node portions, which are wider than the gate edge portions, connect two or more of the gate edge portions, respectively. The grid structure further includes one or more connection sections of the semiconductor portion, wherein the one or more connection sections extend between neighboring transistor sections.

According to an embodiment an electronic assembly includes a semiconductor device that includes needle-shaped field plate structures that extend from a first surface into transistor sections of a semiconductor portion in a transistor cell area. A grid structure separates the transistor sections from each other. Stripe-shaped gate edge portions of the grid structure extend along edges of the transistor sections. Gate node portions, which are wider than the gate edge portions, connect two or more of the gate edge portions, respectively. The grid structure further includes one or more connection sections of the semiconductor portion, wherein the one or more connection sections extend between neighboring transistor sections.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
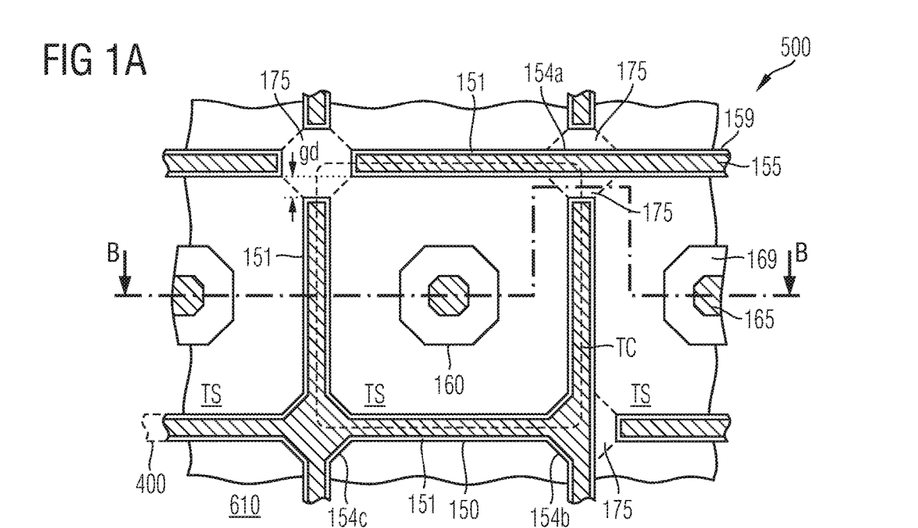
FIG. 1A is a schematic horizontal cross-sectional view of a portion of a semiconductor device including connection sections complementing a gate structure to a complete grid according to an embodiment.
Figure 1B:
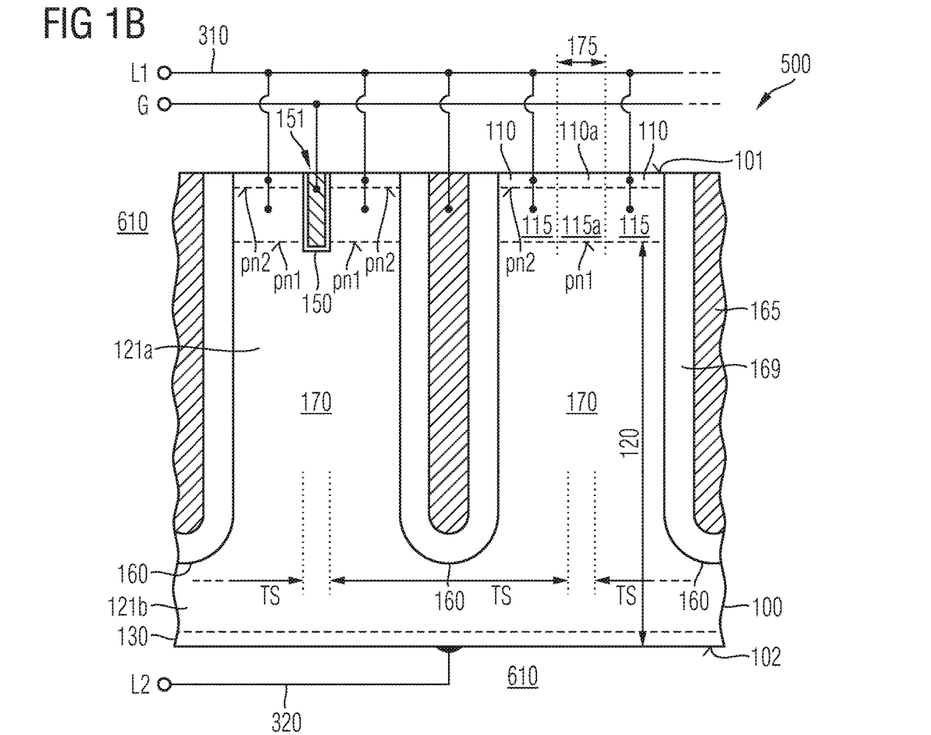
FIG. 1B is a schematic vertical cross-sectional view of the semiconductor device portion of FIG. 1A along line B-B.

FIGS. 1A and 1B refer to a semiconductor device 500 including a plurality of identical transistor cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT (insulated gate bipolar transistor) or an MCD (MOS controlled diode).

The semiconductor device 500 is based on a semiconductor portion 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor portion 100 has a first surface 101 which may be approximately planar or which may be defined by a plane spanned by coplanar surface sections as well as a planar second surface 102 parallel to the first surface 101. A distance between the first and second surfaces 101, 102 depends on a voltage blocking capability the semiconductor device 500 is specified for and may be at least 20 μm. According to other embodiments, the distance may be in the range of several hundred microns. A lateral surface, which is tilted to the first and second surfaces 101, 102, connects the first and second surfaces 101, 102.

In a plane perpendicular to the cross-sectional plane the semiconductor portion 100 may have a rectangular shape with an edge length of several millimeters. A normal to the first surface 101 defines a vertical direction and directions orthogonal to the vertical direction are horizontal directions.

The semiconductor portion 100 includes a drift structure 120 of a first conductivity type as well as a contact portion 130 between the drift structure 120 and the second surface 102. The drift structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between $1E13$ $cm^{-3}$ and $1E18$ $cm^{-3}$, for example, in a range from $5E15$ $cm^{-3}$ to $1E17$ $cm^{-3}$. For a silicon-based semiconductor portion 100 the mean dopant concentration in the drift zone 121 may be between $1E15$ $cm^{-3}$ and $1E17$ $cm^{-3}$, for example, in a range from $5E15$ $cm^{-3}$ to $5E16$ $cm^{-3}$.

The contact portion 130 may be a heavily doped base substrate or a heavily doped layer. Along the second surface 102 a dopant concentration in the contact portion 130 is sufficiently high to form an ohmic contact with a metal directly adjoining the second surface 102. In case the semiconductor portion 100 is based on silicon, in an n-conductive contact portion 130 the dopant concentration along the second surface 102 may be at least $1E18$ $cm^{-3}$, for example at least $5E19$ $cm^{-3}$. In a p-conductive contact portion 130, the dopant concentration may be at least $1E16$ $cm^{-3}$, for example at least $5E17$ $cm^{-3}$. For IGFETs and semiconductor diodes, the contact portion 130 has the same conductivity as the drift zone 121. For IGBTs the contact portion 130 may have the complementary second conductivity type.

The drift structure 120 may include further doped regions, e.g., a field stop layer or a buffer zone between the drift zone 121 and the contact portion 130, barrier zones or counter-doped regions.

Field plate structures 160 extend from the first surface 101 into the semiconductor portion 100. Portions of the field plate structure 160 between the first surface 101 and buried end portions may have approximately vertical sidewalls or may slightly taper at an angle of, e.g., 89 degree with respect to the first surface 101. The sidewalls may be straight or slightly bulgy.

The field plate structures 160 may be equally spaced along parallel lines, wherein a plurality of field plate structures 160 with the same horizontal cross-section area may be arranged along each line, and wherein the lines may be equally spaced.

Each field plate structure 160 includes a conductive field electrode 165 and a field dielectric 169 surrounding the field electrode 165, respectively. The field electrode 165 includes or consists of a heavily doped silicon layer and/or a metal-containing layer. The field dielectric 169 separates the field electrode 165 from the surrounding semiconductor material of the semiconductor portion 100 and may include or consist of a thermally grown silicon oxide layer, a deposited silicon oxide layer, e.g. a silicon oxide based on TEOS (tetraethylorthosilicate), or both.

A vertical extension of the field plate structure 160 is smaller than a distance between the first surface 101 and the contact portion 130 such that the drift zone 121 may include a continuous drift zone section 121b between the field plate structures 160 and the contact portion 130 as well as columnar drift zone sections 121a between neighboring field plate structures 160. The vertical extension of the field plate structures 160 may be in a range from 1 μm to 50 μm, for example in a range from 2 μm to 20 μm. A first horizontal extension of the field plate structures 160 orthogonal to the electrode lines 195 may be in a range from 0.1 μm to 20 μm, for example in a range from 0.2 μm to 5 μm.

For spicular or needle-shaped field electrodes 165, a second horizontal extension of the field electrode 165 orthogonal to the first horizontal extension and parallel to the electrode lines 195 may be at most three times or at most twice as large as the first horizontal extension. The cross-sectional areas of the field electrodes 165 and the field plate structures 160 may be rectangles, regular or distorted polygons with or without rounded and/or beveled corners, ellipses or ovals.

According to an embodiment, the first and second horizontal extensions are approximately equal and the cross-sectional areas of the field electrodes 165 and the field plate structures 160 are circles or regular polygons with or without rounded or beveled corners, such as octagons, hexagons or squares.

The field plate structures 160 allow high dopant concentrations in the drift zone 121 without loss of blocking capability of the semiconductor device 500. Needle-shaped field electrodes 165 increase the available cross-sectional area for the drift zone 121 and therefore reduce the on-state resistance RDSon compared to stripe-shaped field electrodes.

Semiconducting portions of the transistor cells TC are formed in mesa sections 170 of the semiconductor portion 100, wherein each mesa section 170 may surround a field plate structure 160. The mesa sections 170 protrude from a continuous section of the semiconductor portion 100 between the field plate structures 160 and the second surface 102. A horizontal mean width of the mesa sections 170 may be in a range from 0.2 µm to 10 µm, for example in a range from 0.3 µm to 1 µm.

Each mesa section 170 includes a body zone 115 of the second conductivity type. The body zones 115 form first pn junctions pn1 with the drift structure 120, e.g., the columnar drift zone sections 121a, and second pn junctions pn2 with source zones 110 formed between the body zones 115 and the first surface 101. The body zones 115 completely surround the field plate structures 160 in a horizontal plane. Each body zone 115 may include a heavily doped portion for forming an ohmic contact with a metal contact structure.

The source zones 110 may be wells extending from the first surface 101 into the semiconductor portion 100, for example into the body zones 115. One source zone 110 may surround the field plate structure 160 or two or more separated source zones may be formed around the field plate structure 160 in a horizontal plane. The source zone 110 may directly adjoin the field plate structure 160 or may be spaced from the field plate structure 160.

The source zones 110 as well as the body zones 115 are electrically connected to a first load electrode 310. The first load electrode 310 may be electrically coupled or connected to a first load terminal L1, for example the source terminal in case the semiconductor device 500 is an IGFET, an emitter terminal in case the semiconductor device 500 is an IGBT or an anode terminal in case the semiconductor device 500 is a semiconductor diode.

A second load electrode 320, which directly adjoins the second surface 102 and the contact portion 130, may form or may be electrically connected to a second load terminal L2, which may be the drain terminal in case the semiconductor device 500 is an IGFET, a collector terminal in case the semiconductor device 500 is an IGBT or a cathode terminal in case the semiconductor device 500 is a semiconductor diode.

The field electrodes 165 may be electrically connected to the first load electrode 310, to another terminal of the semiconductor device 500, to an output of an internal or external driver circuit, or may float. The field electrodes 165 may also be divided in different subelectrodes which may be insulated from each other and which may be coupled to identical or different potentials.

A grid structure 400 separates the transistor sections TS from each other. The grid structure 400 includes a gate structure 150 and connection sections 175 of the semiconductor portion 100. The connection sections 175 and the gate structure 150 complement each other to the grid structure 400, which is a regular and complete grid. The transistor sections TS form the meshes of the grid structure 400.

The gate structure 150 extends from the first surface 101 into the semiconductor portion 100 and includes stripe-shaped gate edge portions 151 as well as gate node portions 154. Each gate edge portion 151 extends along one common edge of two neighboring transistor sections TS. Within a transistor cell area 610 that includes functional transistor cells TC, each gate edge portion 151 is typically formed between two neighboring transistor sections TS. The gate edge portions 151 have uniform width and are straight without bends. The gate edge portions 151 may be formed along all edges of transistor sections TS of all functional transistor cells TC within the transistor cell area 610.

Gate node portions 154 connect two or more of the gate edge portions 151 with each other and are formed at some or all of the nodes of the grid structure 400. First node portions 154a may connect two of the gate edge portions 151. Second node portions 154b may connect three of the gate edge portions 151. Third node portion 154c may connect four of the gate edge portions 151. The grid structure 400 may include two or more different types of node portions 154a, 154b, 154c.

The gate node portions 154 are formed such that a minimum inner angle of the transistor sections TS is at least 120°, for example at least 135°. In addition, the gate node portions 154 are formed such that a minimum distance between orthogonal gate edge portions 151 is at least 50 nm, for example at least 200 nm.

A horizontal cross-sectional area of the gate node portions 154 may include stripe-shaped partial areas with a width of the gate edge portions 151 and one, two, three or four approximately isosceles triangular partial areas fitting between two of the stripe-shaped partial areas, respectively. A minimum length of the isosceles sides of the triangular partial areas may be at least 50 nm, for example at least 200 nm.

The gate node portions 154 are arranged such that each of the gate edge portions 151 is connected to the other gate edge portions 151 through connections within the transistor cell area 610, through connections outside of the transistor cell area 610, or through both connections within the transistor cell area 610 and connections outside of the transistor cell area 610.

The gate structure 150 with the gate edge portions 151 and the gate node portions 154 includes a conductive gate electrode 155 that includes or consists of a heavily doped polycrystalline silicon layer and/or a metal-containing layer. The gate electrode 155 is completely insulated against the semiconductor portion 100, wherein a gate dielectric 159 separates the gate electrode 155 at least from the body zones 115. The gate dielectric 159 capacitively couples the gate electrode 155 to channel portions of the body zones 115. The gate dielectric 159 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

The gate electrode 155 is electrically connected or coupled to a gate terminal G of the semiconductor device 500.

A vertical extension of the gate structure 150 is smaller than a vertical extension of the field plate structures 160. The vertical extension of the gate structures 150 may be in a range from 100 nm to 5000 nm, for example in a range from 300 nm to 1000 nm. A horizontal width of the gate edge portions 151 may be in a range from 100 nm to 1000 nm, for example, from 200 nm to 800 nm.

The connection sections 175 form gate gaps and may include source portions 110a of the source zones 110 as well as body portions 115a of the body zones 115. A width gd of a gap is defined as a minimum distance between a narrow side or end face of the concerned gate edge portion 151 and the gate node portion 154 or, in the absence of a gate node portion 154, between two narrow sides of opposite gate edge portions 151. The width gd may be in a range from 50 nm to 500 nm, e.g., from 100 nm to 250 nm.

In the illustrated embodiments and for the following description, the body zones 115 are p-type, whereas the source zones 110 and the drift zone 121 are n-type. Similar considerations as outlined below apply also to embodiments with n-type body zones 115, p-type source zones 110, and a p-type drift zone 121.

When a voltage applied to the gate electrode 150 exceeds a preset threshold voltage, electrons accumulate and form inversion channels in the channel portions of the body zones 115 directly adjoining the gate dielectric 159 in the body zones 115. The second pn junctions pn2 with the inversion channels get transparent for electrons in a forward biased state of the semiconductor device 500 with a positive voltage applied between the drift structure 120 and the source zones 110 and a load current flows between the first and second load terminals L1, L2 in vertical direction through the semiconductor device 500.

A gate drain capacity $C_{gd}$ increases with increasing overlap area between the gate electrode 155 and the drift structure 120. Compared to continuous gate electrodes 155, the gate gaps defined by the connection sections 175 do not contribute to the gate drain capacity $C_{gd}$. The gate gaps may significantly reduce the overlap area between the gate electrode 155 and the drift structure 120 and may reduce $C_{gd}$ as well as the reverse transfer capacitance $C_{rss}$.

The reduction in channel width along the longitudinal sides of the gate edge portions 151 may be at least partly compensated by additional channel width along the narrow sides of the gate edge portions 151 along the connection sections 175. Depending on the horizontal cross-sectional shape of the gate edge portions 151 and the uniformity of the gate dielectric 159, a minimum gate width in the range of the gate gap width gd may be sufficient to compensate for or even overcompensate the loss of channel width along the longitudinal direction.

In conventional layouts with a continuous gate electrode surrounding dot-shaped field plate structures 160, the continuous gate electrode forms a continuous, complete grid with nodes where crossing gate electrode portions intersect each other.

In cell layouts with a continuous grid-shaped gate electrode without variation of a width of the continuous gate electrode, the crossing portions of the gate electrode form sharp corners. In and next to the sharp corners, electric fields of the two intersecting gate electrode portions overlap. In the overlapping portions, the threshold voltage is locally reduced compared to portions more distant to the sharp corners.

Figure 2A:
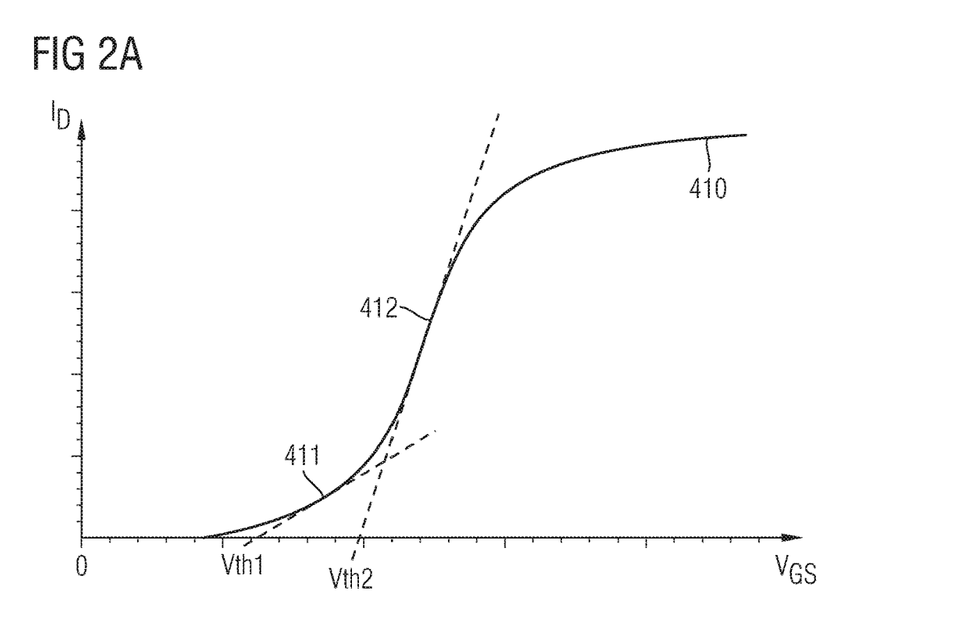
FIG. 2A is a schematic diagram showing a transfer characteristic of a semiconductor device including a gate structure with intersecting gate edge portions that form right-angled corners for discussing effects of the embodiments.

FIG. 2A is a diagram plotting a drain current $I_D$ of an IGFET against a gate-to-source voltage $V_{GS}$ and shows the transfer characteristic 410 of an IGFET with intersecting gate electrode portions forming right-angled corners. A first part 411 of the transfer characteristic 410 originates from the transistor cell portions close to the corners, which are conductive yet at a low first threshold voltage Vth1. A second part 412 originates from the transistor cell portions distant to the corners, which conduct a load current only above a second threshold voltage Vth2 higher than Vth1.

For ensuring the defined target threshold voltage Vth of, e.g., 10V, the threshold voltage in the complete transistor cell TC is shifted to higher values such that the first threshold voltage Vth1 is equal to or higher than the target threshold voltage Vth. As a side effect, the second threshold voltage Vth2 in portions distant to the corners is shifted to beyond the target threshold voltage. The portions distant to the corners cannot completely turn on at Vth and, as a further consequence, the on-resistance RDSon is higher than in the case that the portions distant to the corners fully turn on.

Figure 2B:
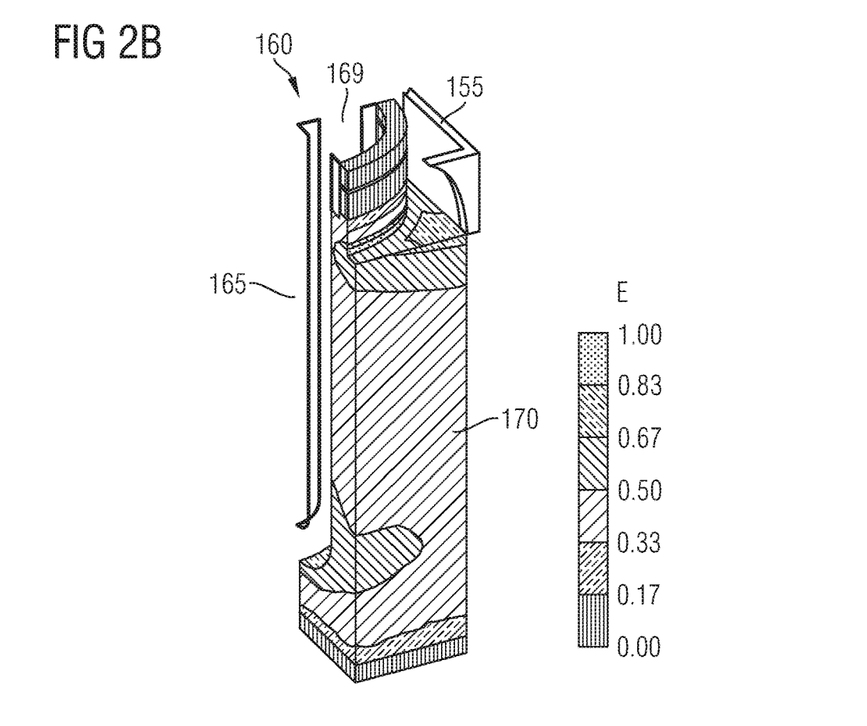
FIG. 2B is a schematic perspective view of a portion of a semiconductor device showing the electric field strength distribution in a conventional device with needle-shaped field plate structures for discussing effects of the embodiments.

FIG. 2B shows the local increase of the electric field strength in a transistor section along the bottom of a gate electrode 155 in the surroundings of a 900 corner of the transistor section.

The gate node portions 154 avoid the local reduction of the threshold voltage Vth by avoiding sharp corners at the expense of larger cross-sectional area and higher $C_{gd}$.

Other than in layouts with the gate electrode integrated in the vertical projection of a field electrode that directly shields the gate electrode towards the drain potential, for grid-like gate structures the field electrodes in the meshes of the grid are outside a direct connection line between gate electrode and drain potential and the shielding effect of the field electrodes against the drain potential is weakest at the nodes of the grid. In addition, the projected area of the gate structure 150 onto the drain electrode is high. As a consequence, gate drain capacitance $C_{gd}$ and Millar charge $Q_{gd}$ are comparatively high.

In addition, the gate node portions 154 locally widen up the gate structures 150 at and next to the nodes of the grid. Since the width of the gate structure 150 is typically defined by the width of a gate trench, which in the course of manufacturing is etched into the semiconductor portion 100 and which later is filled with the gate electrode and since in typical etch regimes for a given etch time a depth of an etched trench depends on the width of the etched trench, locally widening the gate structures 150 at the nodes typically results in gate electrodes with locally increased vertical extension at and around the nodes. The increased vertical extension locally brings the gate electrode closer to the drain electrode and thus further increases $C_{gd}$. As a result, a shape of the gate node portions 154 that is suitable for levelling the threshold voltage in the corner sections of the transistor sections TS significantly increases the Miller charge $Q_{gd}$.

The connection sections 175 of the material of the semiconductor portion 100 both reduce the projection area of the gate structure 150 onto the drain electrode and reduce the cross-sectional area of portions of the gate structure 150 with greater vertical extension and smaller distance to the second surface 102 with the drain electrode. In total, the connection sections 175 noticeably reduce $Q_{gd}$.

A semiconductor device 500 with the grid structure 400 as illustrated in FIGS. 1A and 1B shows on the one hand gate node portions 154 that avoid a local reduction of the threshold voltage. On the other hand, the connection sections 175 reduce $Q_{gd}$ without additional effort and costs and without adding process complexity but only by an uncritical change of a lithographic mask pattern.

Figure 3A:
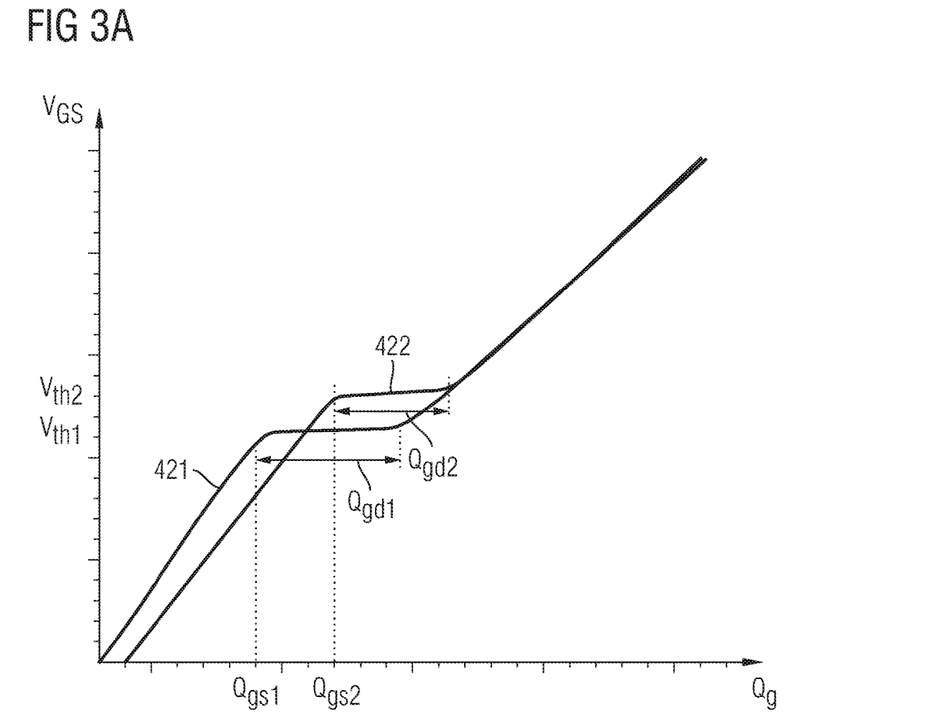
FIG. 3A is a schematic diagram for illustrating the gate-to-source voltage as a function of the gate charge for a comparative example and for a semiconductor device according to the embodiments for discussing effects of the embodiments.

In FIG. 3A line 421 shows the gate-to-source voltage $V_{GS}$ as a function of the gate charge $Q_g$ of a transistor cell with a square transistor section TS, a needle-shaped field electrode centered to the transistor section TS, four gate edge portions parallel to the edges of the transistor section TS and polygonal gate node portions 154 at all four corners of the transistor section TS. At first the gate current mainly charges $C_{gs}$ and the gate-to-source voltage $V_{GS}$ increases gradually. When $V_{GS}$ reaches the threshold voltage $V_{th}$, $V_{ds}$ begins to rise and the gate current mainly charges $C_{gd}$. After the transistor cell TC has fully turned on, $V_{GS}$ again rises. The portion of gate charge $Q_g$ charged during the Miller phase is defined as gate drain charge $Q_{gd}$ or Miller charge.

Line 422 shows $V_{GS}(Q_g)$ for a transistor cell TC with gate edge portions 151 and with connection sections 175 of the semiconductor portion 100 replacing the gate node portions of the comparative example. The Miller charge $Q_{gd1}$ of the transistor cell with four gate node portions 154 at all four corners is significantly higher than the Miller charge $Q_{gd2}$ of the transistor cell with no gate node portions 154 at all four corners. The reduction in gate drain charge $Q_{gd}$ may be 20%.

The values for layouts replacing only a portion of the gate nodes with connection sections 175 may be approximated by interpolation of lines 421, 422. For example, a layout that replaces 50% of the gate node portions completely with connection sections 175, $Q_{gd}$ may be reduced by about 10%.

Since FIG. 3A does not consider the local increase of the vertical extension of the gate structure 150 in the gate node portions 154, the actual impact of the cell layout on $C_{gd}$ may be even larger, since the presence of the separation regions 175 locally reduces or avoids the local increase of the vertical extension of such gate node portions that connect two or three gate edge portions 151 instead of four gate edge portions 151 at all four sides.

Figure 3B:
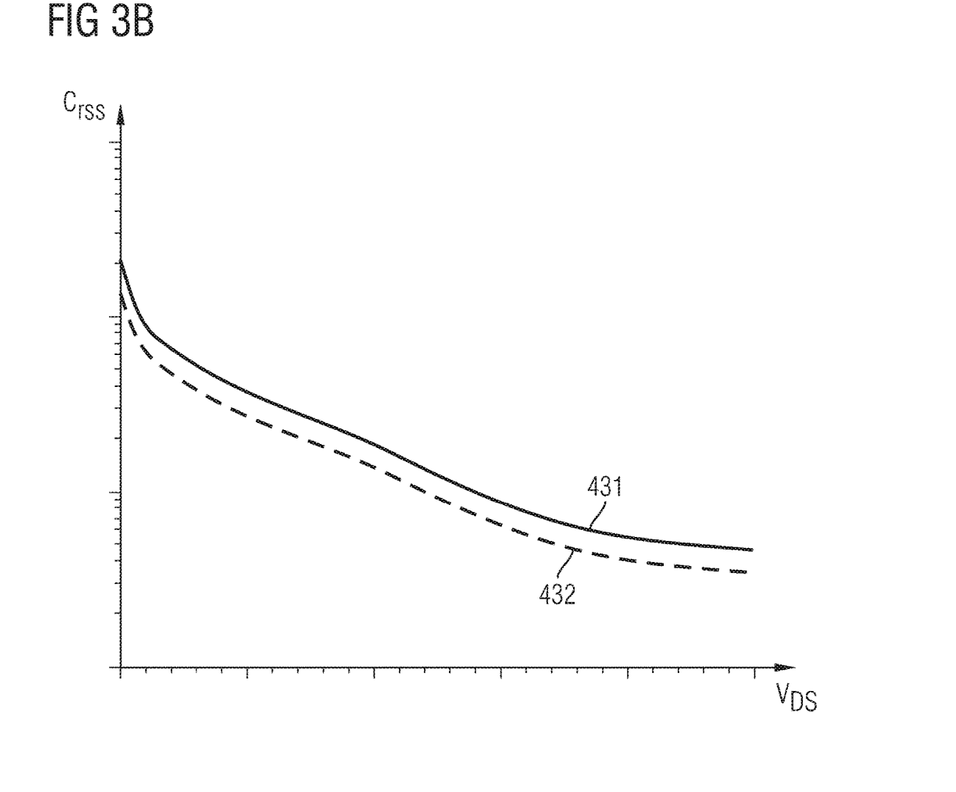
FIG. 3B is a schematic diagram illustrating the reverse transfer capacitance as a function of the drain-to-source voltage for discussing effects of the embodiments.

FIG. 3B illustrates the effect of the connection sections 175 on the reverse transfer capacitance $Cr_{ss}$. Line 431 refers to the reference example with four diamond-shaped gate node portions at all four corners of a square-shaped transistor cell TC. Line 432 shows $C_{rss}$ for a transistor cell with connection sections 175 from the semiconductor portion 100 separating neighboring gate edge portions 151 at all four corners.

Figure 4A:
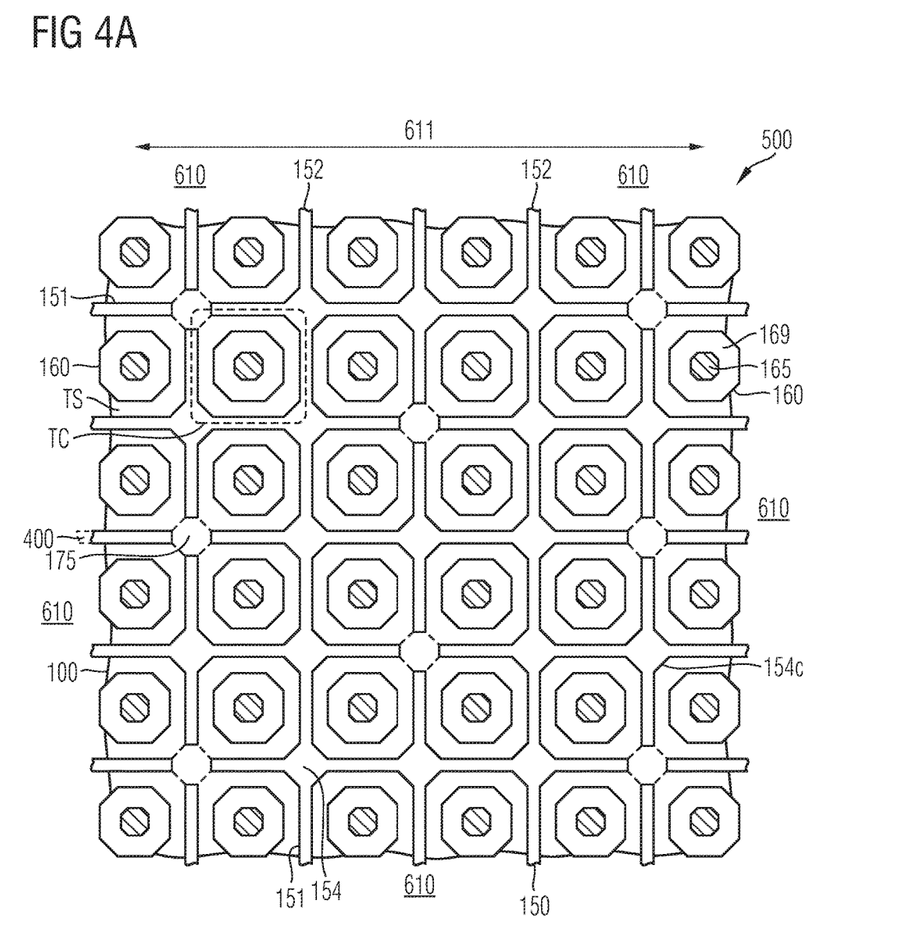
FIG. 4A is a schematic horizontal cross-sectional view of a portion of a semiconductor device according to an embodiment concerning square transistor cells and a grid structure with line portions connected in a central portion of a transistor cell area.
Figure 4B:
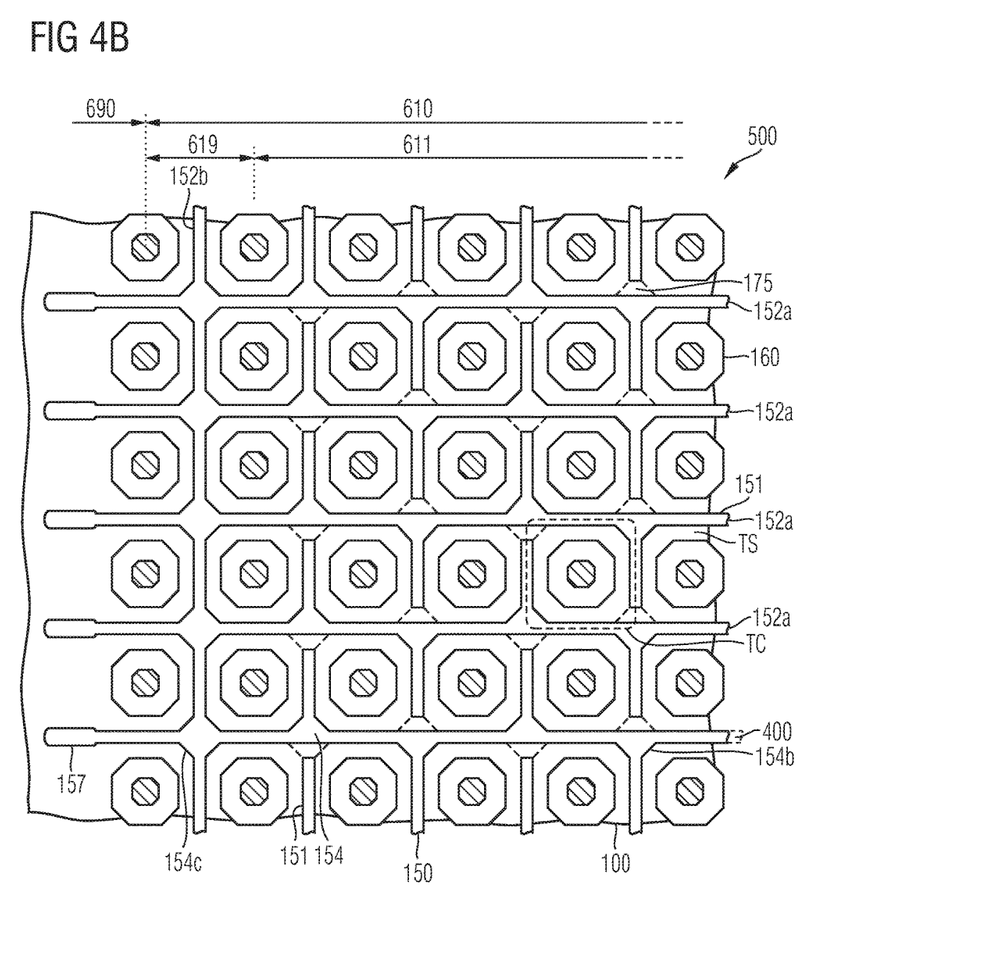
FIG. 4B is a schematic horizontal cross-sectional view of a portion of a semiconductor device according to an embodiment concerning square transistor cells and a grid structure with line portions connected in a peripheral portion of a transistor cell area.
Figure 4C:
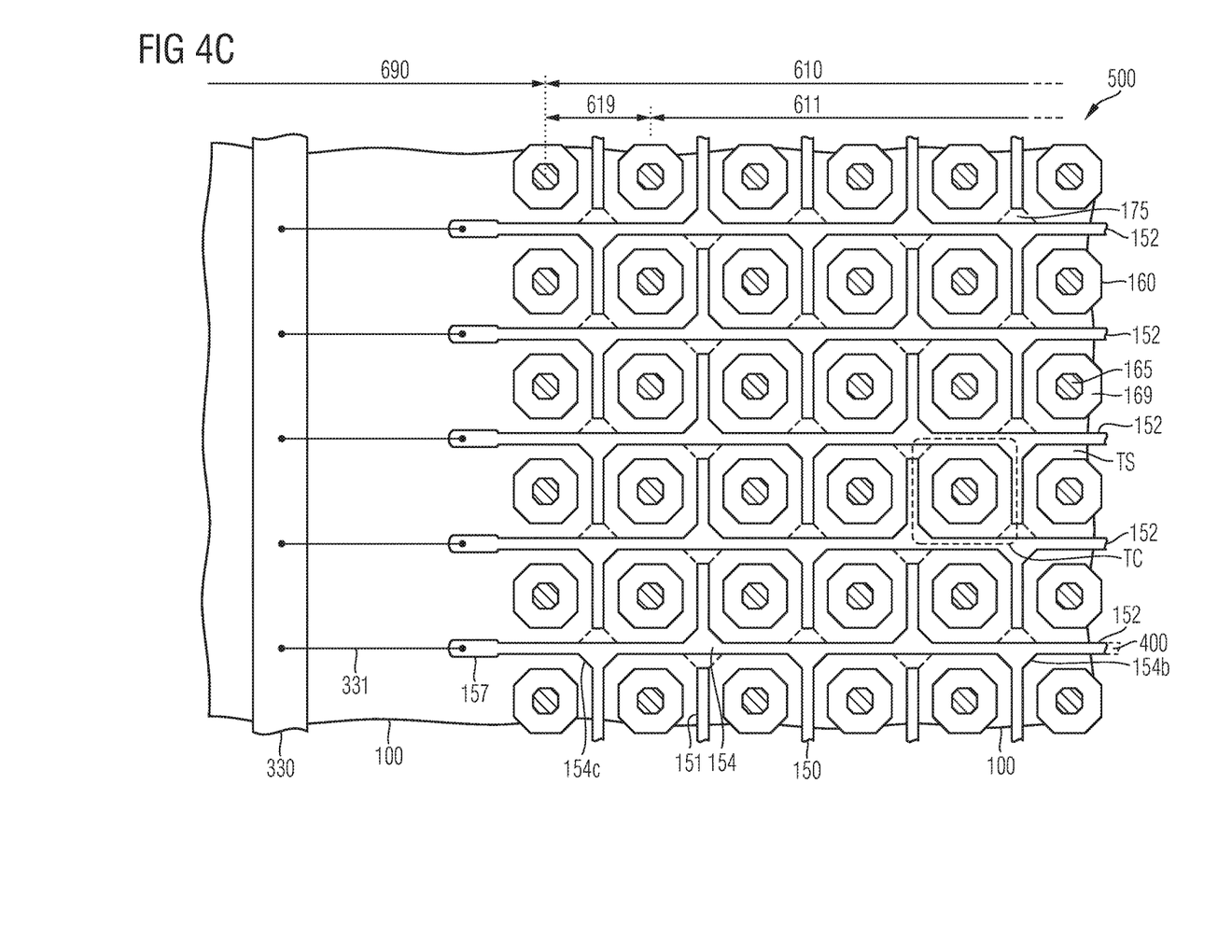
FIG. 4C is a schematic horizontal cross-sectional view of a portion of a semiconductor device according to an embodiment concerning square transistor cells and a grid structure with line portions connected in an edge area outside of the transistor cell area.

FIGS. 4A to 4C refer to semiconductor devices 500 with square transistor cells TC. Field plate structures 160 are formed in the center of the transistor cells TC. A grid structure 400 forms a regular grid with approximately square meshes around the transistor sections TS of the transistor cells TC.

The grid structure 400 includes a gate structure 150 and a plurality of connection sections 175 complementing the gate structure 150 to a complete grid. The gate structure 150 includes stripe-shaped gate edge portions 151 and gate node portions 154 connecting neighboring ones of the gate edge portions 151.

In FIG. 4A the gate node portions 154 of the gate structure 150 are third node portions 154c connecting four adjoining gate edge portions 151 at first nodes of the grid structure 400. The gate node portions 154 are formed such that a minimum inner angle of the transistor section TS is at least 120°, for example at least 135°. In addition, the gate node portions 154 are formed such that a minimum distance between orthogonal gate edge portions 151 is at least 50 nm, for example at least 200 nm. For example, a horizontal cross-sectional area of the gate node portions 154 includes stripe-shaped partial areas with a width of the gate edge portions 151 and four approximately isosceles partial areas fitting between two of the stripe-shaped partial areas, respectively. A minimum length of the isosceles sides of the triangular partial areas may be at least 50 nm, for example at least 200 nm.

The connection sections 175 separate end faces of gate edge portions 151 that face each other at the connection section 175 between the concerned gate edge portions 151.

The gate structure 150 includes a plurality of line portions 152 extending along the same horizontal direction, wherein each line portion 152 includes a plurality of the gate edge portions 151 formed along a straight line and connected through node portions 155. The line portions 152 may extend through a complete transistor cell area 610, wherein the transistor cell area 610 includes controllable, functional transistor cells TC through which a load current flows in an on-state of the semiconductor device 500. A termination area that does not include functional transistor cells typically surrounds the transistor cell area 610. For example, the termination area may be an edge area that separates the transistor cell area 610 from an outer lateral surface of the semiconductor portion 100.

Gate edge portions 151 oriented orthogonal to the line portions 152 may connect the line portions 152 to each other within a central portion 611 of the transistor cell area 610. Along lines orthogonal to the line portions 152 each forth grid node may be without any grid node portion 154 such that the portion of $C_{gd}$ resulting from the gate node portions 154 is reduced by about 25% with respect to a comparative cell layout with third node portions 154c at each grid node. In addition, each gate edge portion 151 is basically electrically connected in all four horizontal directions and a variation of a gate conductor resistance among the transistor cells TC is comparatively low.

In FIG. 4B the grid structure 150 includes first line portions 152a which are separated from each other in a central portion 611 of the transistor cell area 610 and which are connected to each other in a transition region 619 of the transistor cell area 610 through one or more second line portions 152b running orthogonal to the first line portions 152a, wherein the transition region 619 separates the central portion 611 from a termination area 690.

In the central portion 611, the grid structure 140 may include second node portions 154b electrically connecting three gate edge portions 154, respectively, and each grid node includes one second gate node portion 154b and one connection section 175 between a gate edge portion 151 and the second gate node portion 154b. In the transition region 619, the grid structure 400 may include third node portions 154c connecting four adjoining gate edge portions 151, respectively. Within the central portion 611 the contribution of the gate node portions 154 to $C_{gd}$ may be reduced by a measurable amount with respect to a cell layout without connection sections 175.

The gate structure 150 may further include contact sections 157 in the termination area 690, wherein a width of the contact sections 157 may be greater than a width of the gate edge portions 151.

In FIG. 4C the grid structure 400 includes line portions 152 which are separated from each other within the transistor cell area 610. A gate connector 330, e.g., a metallic structure such as a gate runner, a gate finger or a gate ring electrically connects the line portions 152 in the termination area 690. A gate wiring 331 may electrically connect the gate connector 330 with the line portions 152 through the contact sections 157.

Figure 5:
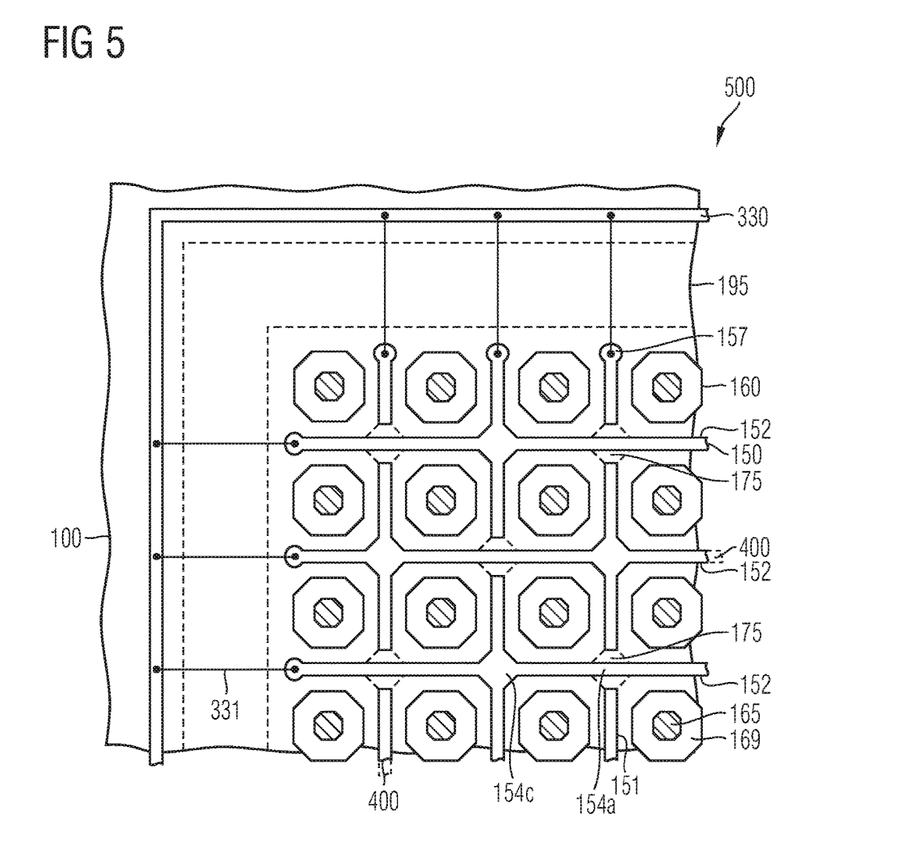
FIG. 5 is a schematic horizontal cross-sectional view of a portion of a semiconductor device according to an embodiment concerning square transistor cells and line portions.

FIG. 5 shows a gate connector 330 that may form a gate runner, or, e.g. for semiconductor devices with high blocking capability, a closed gate ring or an arrangement of three line portions forming a "U". An edge termination 195 is formed in the termination area 690 between the gate runner 330 and the transistor cell area 610 and may surround the transistor cell area 610. The gate structure 150 includes line portions 152, wherein each line portion 152 may include gate edge portions 151 arranged along a straight line, first gate node portions 154a connecting two neighboring gate edge portions 151 and third gate node portions 154c connecting four neighboring gate edge portions 151. The first and third gate node portions 154a, 154c may be alternatingly arranged. According to an embodiment, the first and third gate node portions 154a, 154c may form a regular checkerboard pattern.

Figure 6:
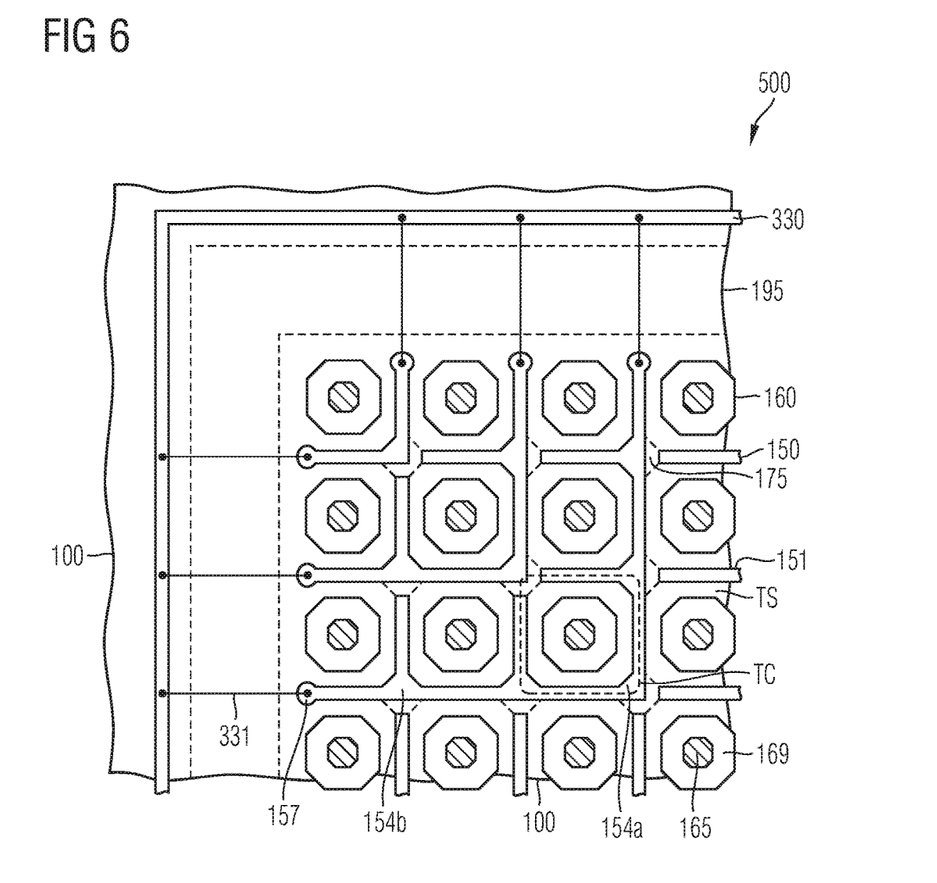
FIG. 6 is a schematic horizontal cross-sectional view of a portion of a semiconductor device according to an embodiment concerning square transistor cells and a gate structure with gate node portions connecting three line portions and with gate node portions connecting two orthogonal line portions.

In FIG. 6 the gate structure 150 includes first gate node portions 154a of a type connecting orthogonal gate edge portions 151 as well as second gate node sections 154b connecting three gate edge portions 151. At least a central portion 611 of the transistor cell area 610 may be devoid of both third gate node portions 154c and first gate node portions 154a of a type connecting gate edge portions 151 arranged at the same line. The cell layout hence avoids third gate node portions 154c with comparatively wide cross-sections and hence comparatively large vertical extension.

Figure 7:
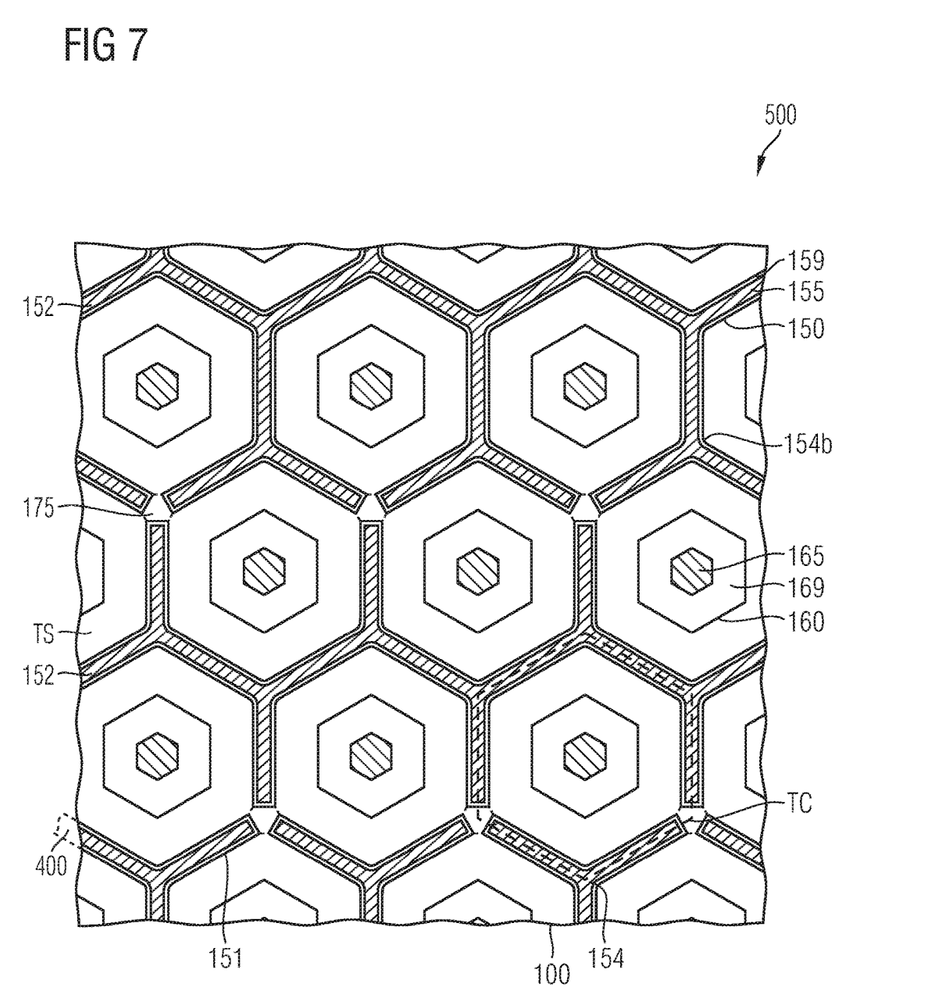
FIG. 7 is a schematic horizontal cross-sectional view of a portion of a semiconductor device according to an embodiment concerning hexagonal transistor cells.

FIG. 7 refers to a grid structure 400 with hexagonal transistor cells TC.

Figure 8:
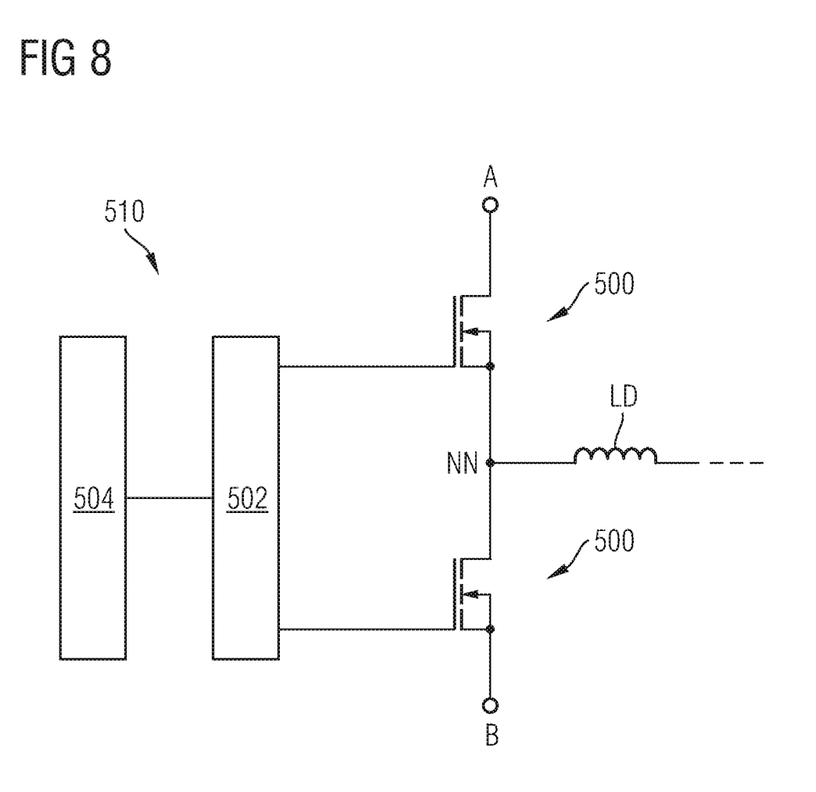
FIG. 8 is a schematic circuit diagram of an electronic assembly according to an embodiment related to switched-mode power supplies and motor drives.

FIG. 8 refers to an electronic assembly 510 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 510 may include two identical semiconductor devices 500 as described above. The semiconductor devices 500 may be IGFETs and the load paths of the two semiconductor devices 500 are electrically arranged in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electronic assembly may further include a control circuit 504 configured to supply a control signal for alternately switching on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, wherein the network node NN is electrically connected to a motor winding and the supply terminals A, B supplying a DC voltage.

According to another embodiment, the electronic assembly 510 may be a primary side stage of a switched mode power supply with the supply terminals A, B supplying an AC voltage of an input frequency to the electronic circuit 510. The network node NN is electrically connected to a primary winding of a transformer.

The electronic assembly 510 may be a synchronous rectifier of a switched mode power supply with the supply terminals A, B connected to a secondary winding of the transformer and the network node NN electrically connected to a reference potential of the electronic circuit at the secondary side of the switched mode power supply.

According to a further embodiment, the electronic assembly 510 may be a primary side stage of a DC-to-DC converter, e.g., a power optimizer or a micro-inverter for applications including photovoltaic cells with the supply terminals A, B supplying a DC voltage to the electronic assembly 510 and the network node NN electrically connected to an inductive storage element.

According to another embodiment, the electronic assembly 510 may be a secondary side stage of a DC-to-DC converter, e.g., a power optimizer or a micro-inverter for applications including photovoltaic cells, wherein the electronic circuit 510 supplies an output voltage to the supply terminals A, B and wherein the network node NN is electrically connected to the inductive storage element.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   needle-shaped field plate structures extending from a first surface into transistor sections of a semiconductor portion in a transistor cell area; and
   a grid structure separating the transistor sections from each other, the grid structure comprising:
     stripe-shaped gate edge portions extending along one edge of the transistor sections, respectively;
     gate node portions wider than the gate edge portions and connecting two or more of the gate edge portions, respectively; and
     one or more connection sections of the semiconductor portion, wherein the one or more connection sections extend between neighboring transistor sections.

2. The semiconductor device of claim 1, wherein the gate node portions comprise first node portions connecting two of the gate edge portions respectively.

3. The semiconductor device of claim 1, wherein the gate node portions comprise at least one of second node portions and third node portions, the second node portions connecting three of the gate edge portions, respectively and the third node portions connecting four or more of the gate edge portions, respectively.

4. The semiconductor device of claim 2, wherein the gate node portions are formed such that outer corners of the transistor sections have an angle of at least 120 degree.

5. The semiconductor device of claim 1, wherein at least one of the one or more connection sections separates a gate edge portion from a gate node portion.

6. The semiconductor device of claim 1, wherein at least one of the one or more connection sections separates two or more neighboring gate edge portions.

7. The semiconductor device of claim 1, wherein the gate node portions are at first nodes of the grid structure and the one or more connection sections are at complementing second nodes of the grid structure.

8. The semiconductor device of claim 1, wherein the gate node portions are formed such that a minimum distance between orthogonal gate edge portions adjoining to the gate node portions is at least 50 nm.

9. The semiconductor device of claim 1, wherein a horizontal cross-sectional area of the gate node portions includes stripe-shaped partial areas with a width of the gate edge portions and at least one isosceles triangular partial area fitting between two of the stripe-shaped partial areas.

10. The semiconductor device of claim 9, wherein a minimum length of the isosceles sides of the triangular partial areas is at least 50 nm.

11. The semiconductor device of claim 1, wherein the grid structure comprises a plurality of line portions, each line portion comprising a plurality of the gate edge portions arranged along a straight line and connected through node portions, respectively.

12. The semiconductor device of claim 11, wherein in a central portion of the transistor cell area the line portions are connected to each other through gate edge portions and gate node portions.

13. The semiconductor device of claim 12, further comprising:
second line portions running, in the central portion, orthogonal to the first line portions and connecting the first line portions.

14. The semiconductor device of claim 11, further comprising:
further second line portions running, in a transition region, orthogonal to the first line portions and connecting the first line portions.

15. The semiconductor device of claim 11, further comprising:
a gate connector in a termination area, wherein the termination area surrounds the transistor cell area and is devoid of transistor cells and wherein the gate connector electrically connects gate electrodes in the line portions.

16. The semiconductor device of claim 1, wherein the transistor sections are rectangular with beveled and/or rounded corners.

17. The semiconductor device of claim 1, wherein the gate edge portions, the gate node portions and the one or more connection sections complement each other to a complete grid.

18. The semiconductor device of claim 1, wherein the one or more connection sections connect two or more neighboring transistor sections, respectively.

19. The semiconductor device of claim 1, wherein the gate edge portions are stripes of uniform width.

20. The semiconductor device of claim 1, wherein the one or more connection sections separate at least three gate edge portions or one gate node portion and one gate edge portion from each other.

21. An electronic assembly, comprising:
a semiconductor device comprising:
needle-shaped field plate structures extending from a first surface into transistor sections of a semiconductor portion in a transistor cell area; and
a grid structure separating the transistor sections from each other, the grid structure comprising:
stripe-shaped gate edge portions extending along one edge of the transistor sections, respectively;
gate node portions wider than the gate edge portions and connecting two or more of the gate edge portions, respectively; and
one or more connection sections of the semiconductor portion, wherein the one or more connection sections extend between neighboring transistor sections.

* * * * *